United States Patent
Lavoie

(10) Patent No.: US 7,566,661 B2
(45) Date of Patent: Jul. 28, 2009

(54) ELECTROLESS TREATMENT OF NOBLE METAL BARRIER AND ADHESION LAYER

(76) Inventor: Adrien R. Lavoie, 6670 SW. 169th Ave., Beaverton, OR (US) 97007

(*) Notice: Subject to any disclaimer, the term of this patent is extended or adjusted under 35 U.S.C. 154(b) by 199 days.

(21) Appl. No.: 11/438,793

(22) Filed: May 22, 2006

(65) Prior Publication Data

US 2007/0269981 A1 Nov. 22, 2007

(51) Int. Cl.
*H01L 21/44* (2006.01)

(52) U.S. Cl. .................. 438/681; 438/650; 438/676; 438/678; 438/686; 257/E23.162; 257/E23.021; 257/E21.074; 257/E21.584

(58) Field of Classification Search ............... 438/637, 438/638, 650, 676, 678, 681, 686; 257/E21.579, 257/E23.162, E23.021, E21.074, E21.584
See application file for complete search history.

(56) References Cited

U.S. PATENT DOCUMENTS

| 7,211,508 B2* | 5/2007 | Chung et al. ............. 438/633 |
| 2004/0009307 A1* | 1/2004 | Koh et al. ............. 427/569 |
| 2004/0192021 A1* | 9/2004 | Li ............. 438/622 |
| 2005/0009325 A1* | 1/2005 | Chung et al. ............. 438/637 |
| 2006/0223300 A1* | 10/2006 | Simka et al. ............. 438/618 |
| 2007/0207611 A1* | 9/2007 | Lavoie et al. ............. 438/687 |

* cited by examiner

*Primary Examiner*—Michelle Estrada
(74) *Attorney, Agent, or Firm*—Rahul D. Engineer

(57) ABSTRACT

A method of forming an EL-Cu enhanced noble metal layer begins with providing a semiconductor substrate in a reaction chamber, wherein the semiconductor substrate includes a trench etched into a dielectric layer. Next, an organometallic precursor containing a noble metal and a reactive gas are pulsed into the reaction chamber proximate to the semiconductor substrate where they react to form a noble metal layer directly on the dielectric layer within the trench. The substrate is then moved into an electroless plating bath and an electroless plating process deposits a copper seed layer onto the noble metal layer. The substrate is then removed from the plating bath.

5 Claims, 13 Drawing Sheets

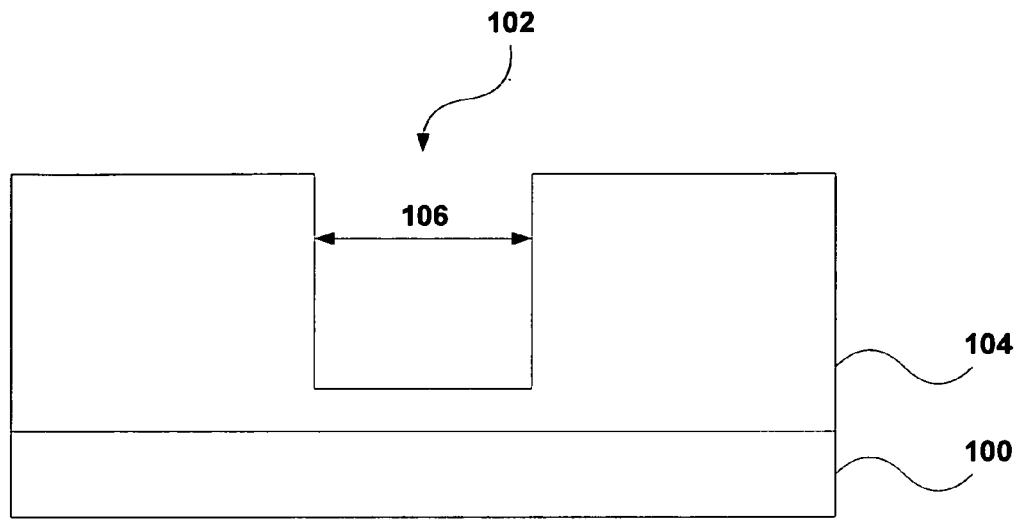
FIG._1A
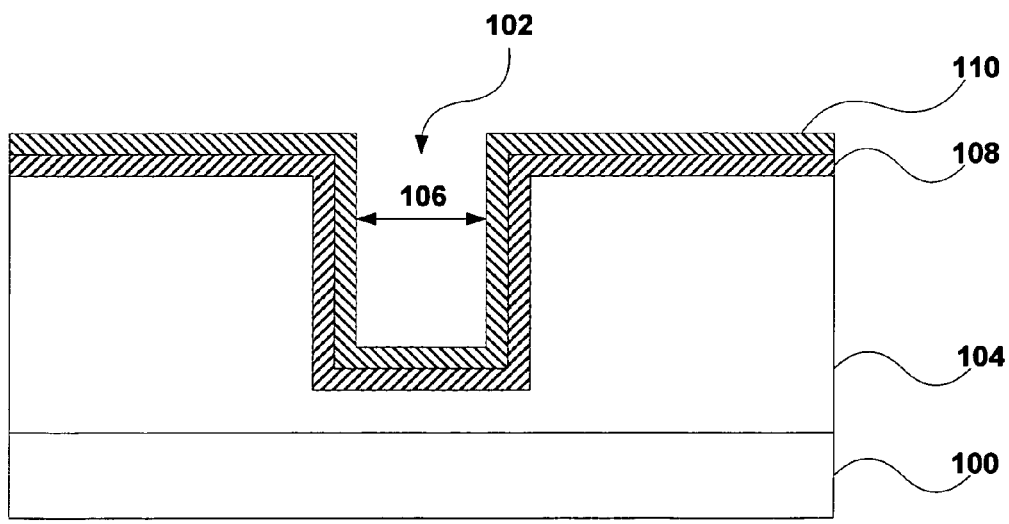
FIG._1B

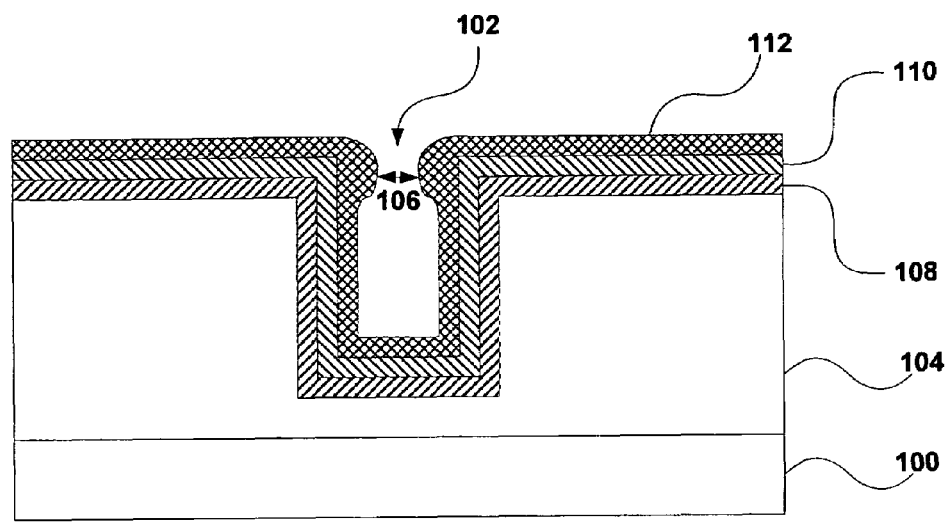
FIG._1C
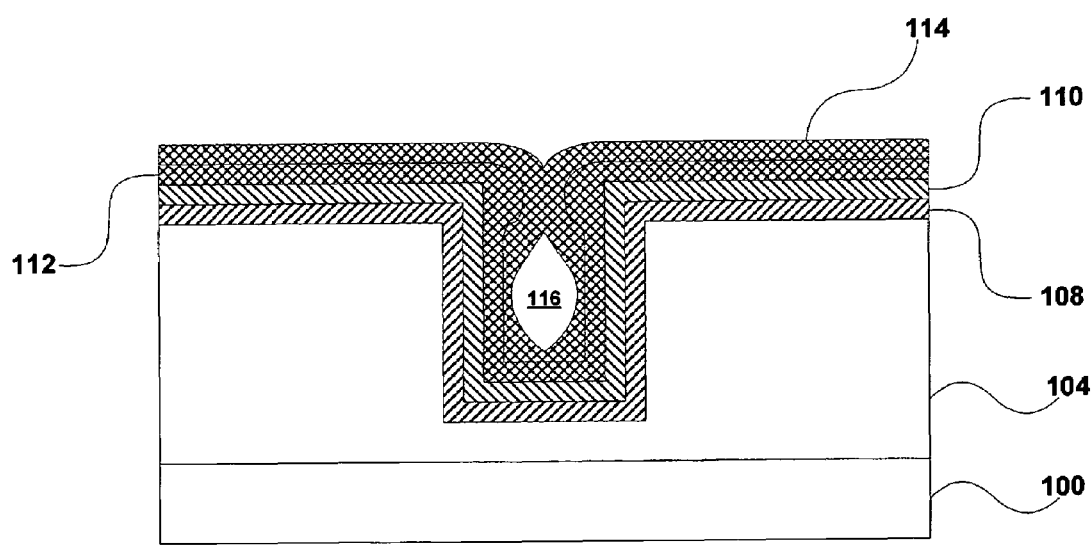
FIG._1D

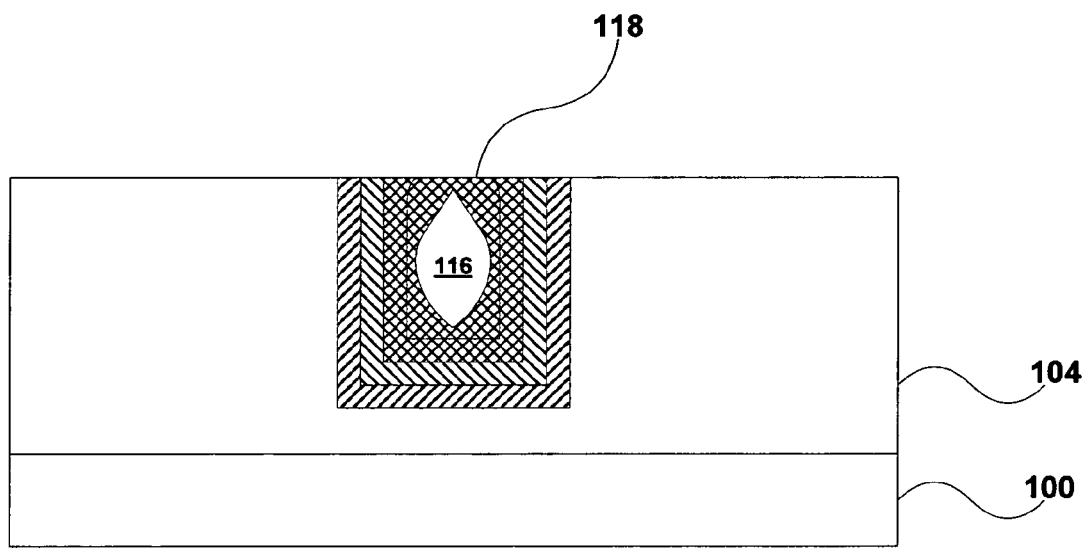
FIG._1E

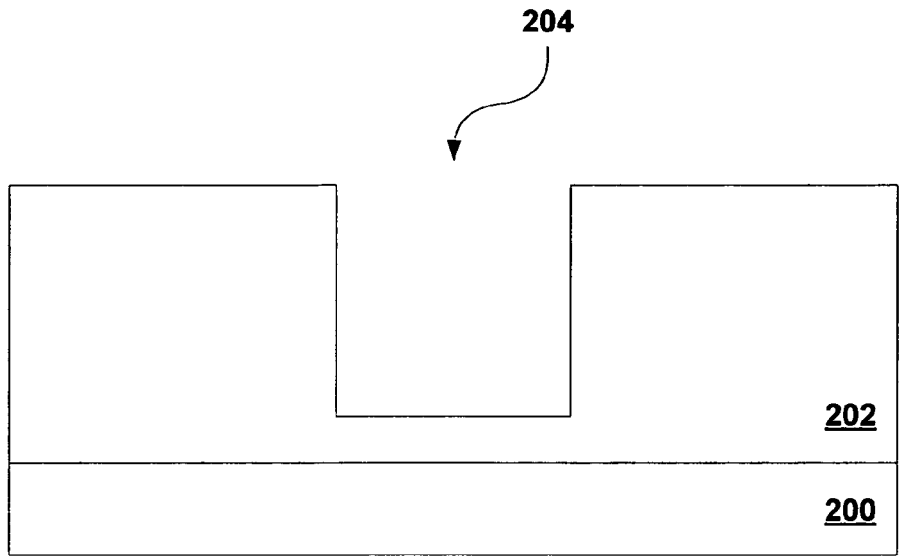
FIG._2A
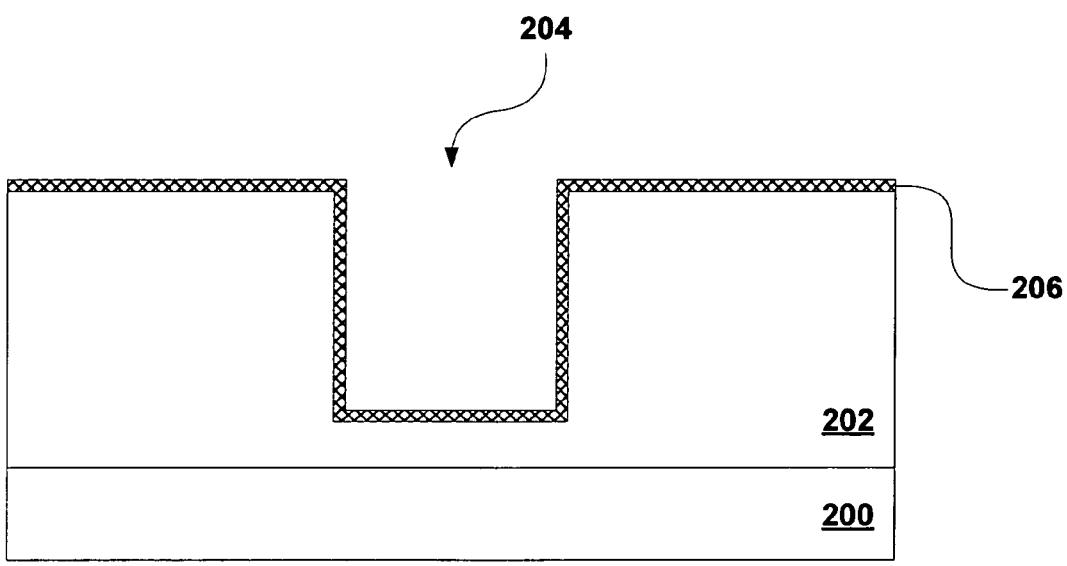
FIG._2B

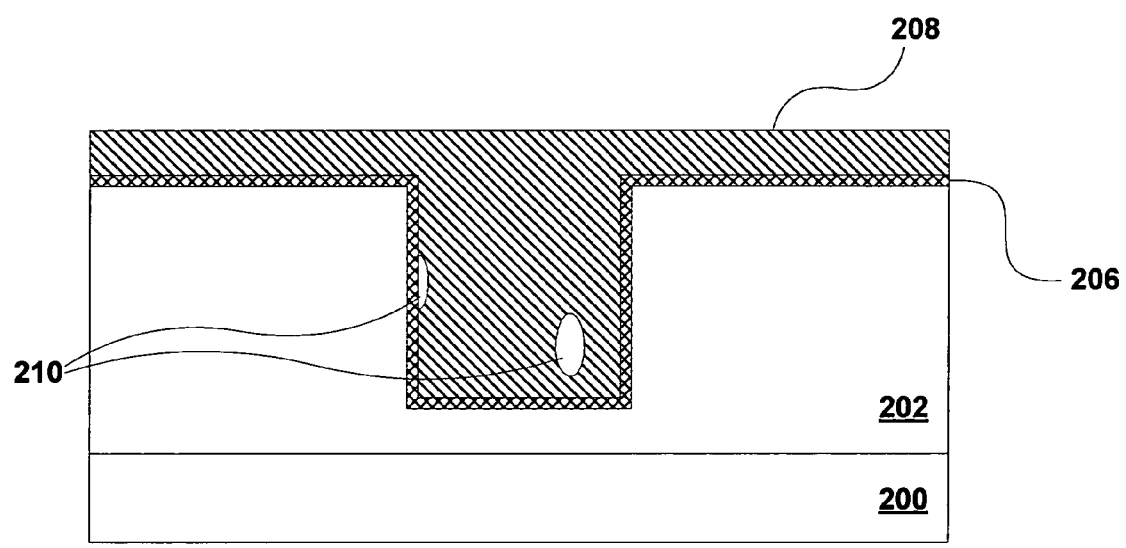
FIG._2C

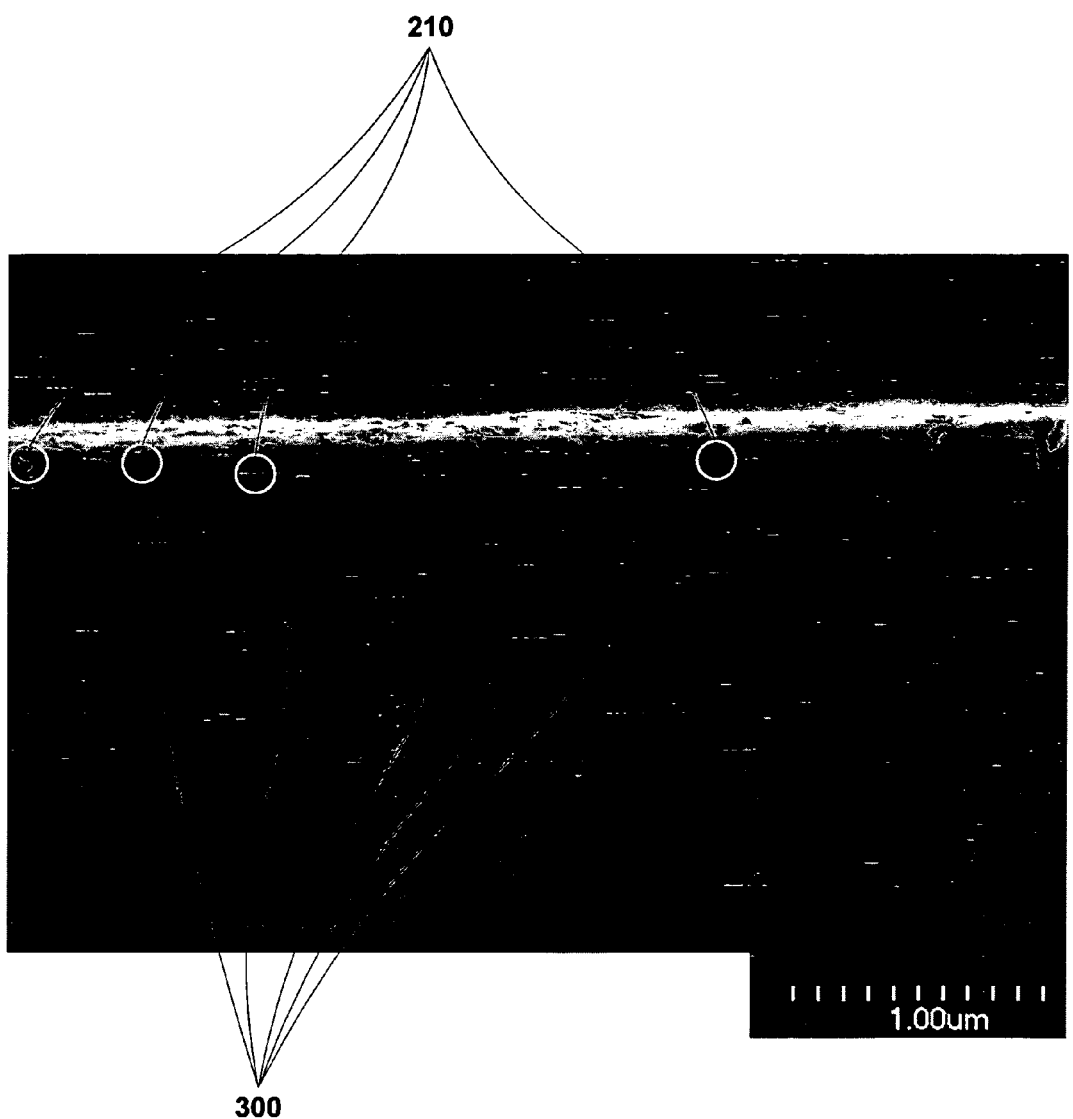
FIG._3

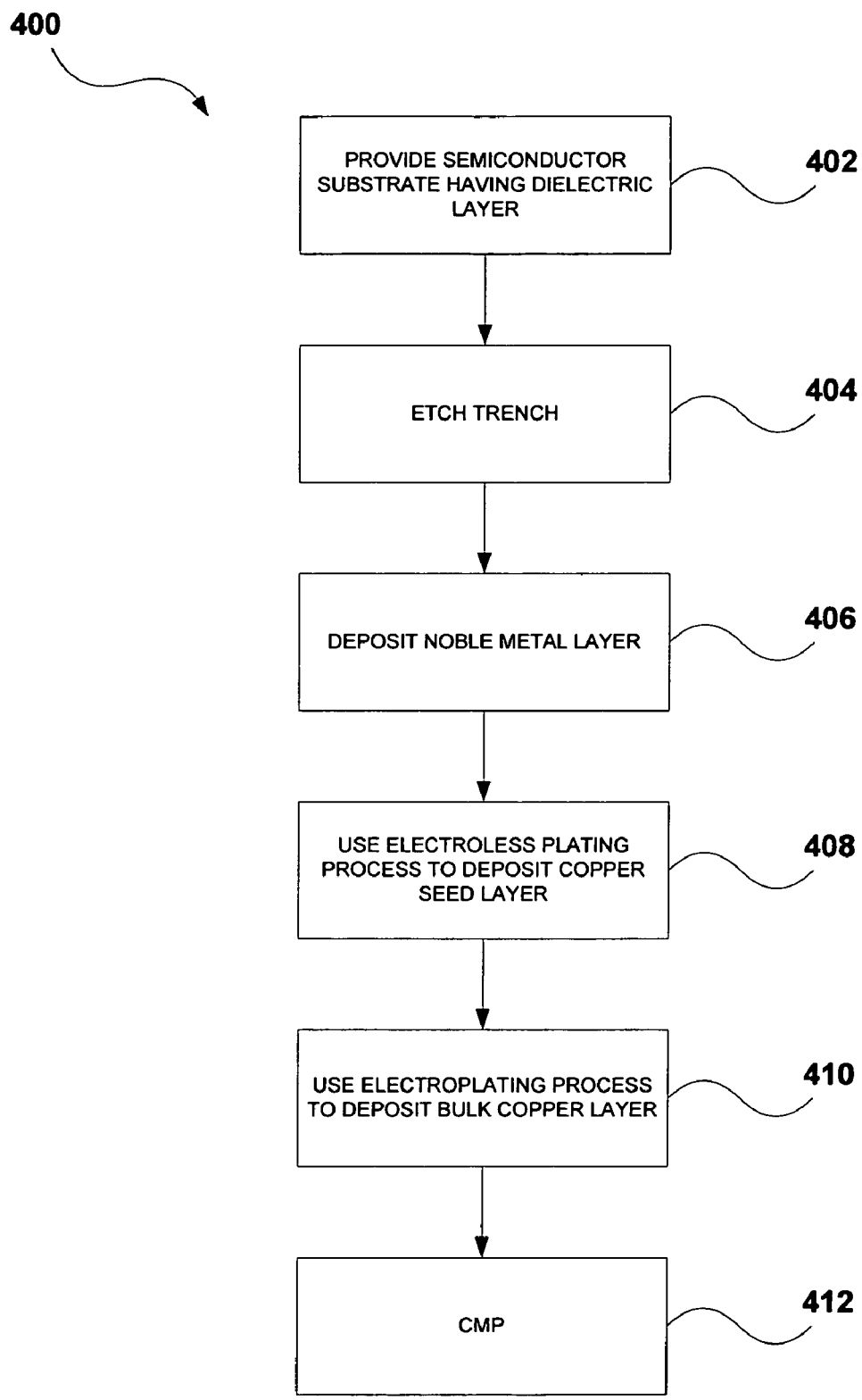
FIG._4

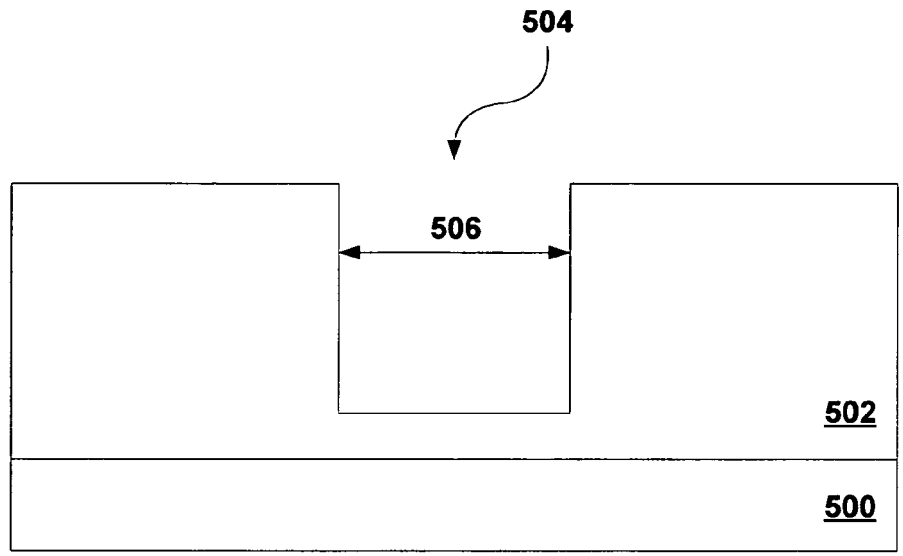
FIG._5A
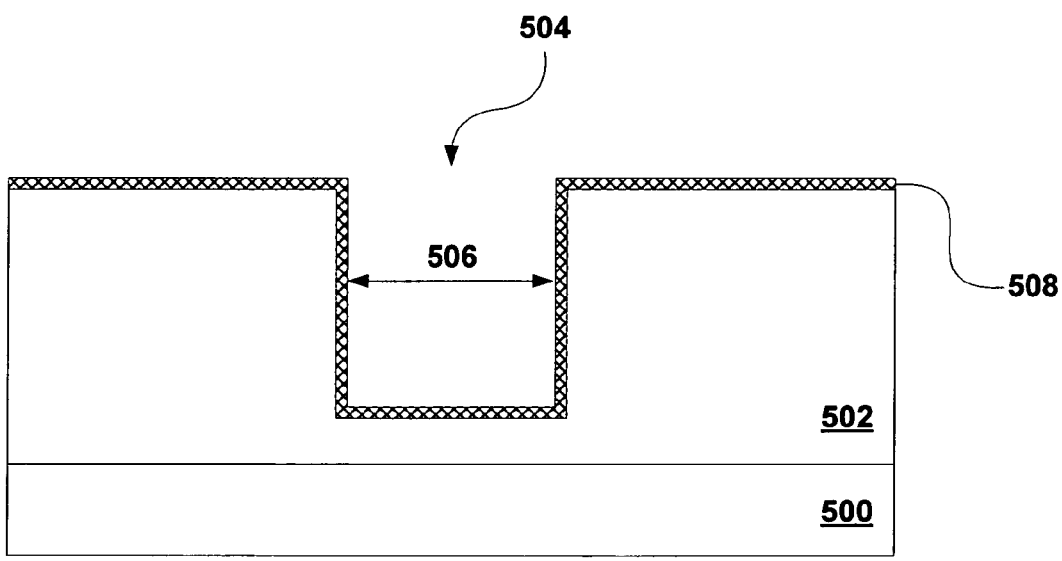
FIG._5B

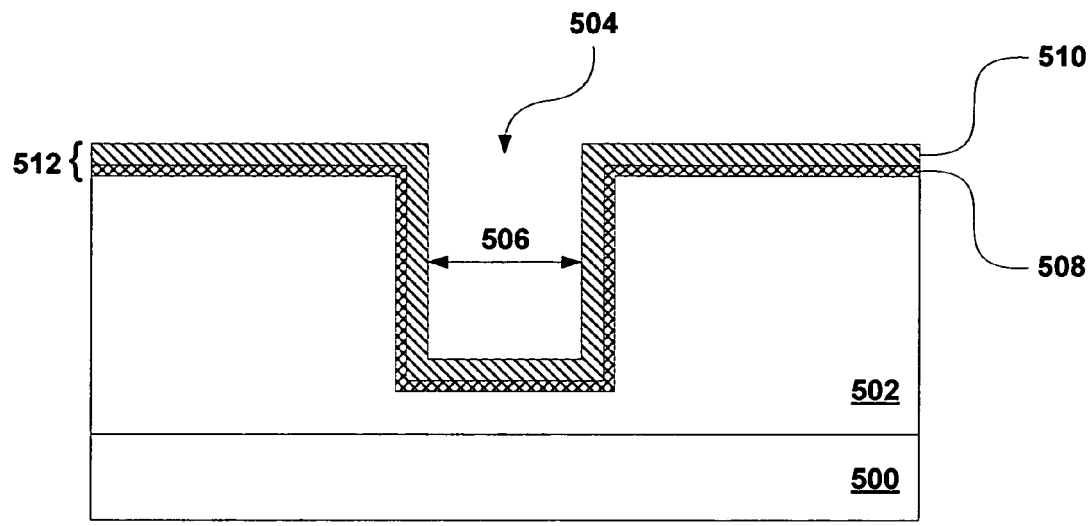
FIG._5C
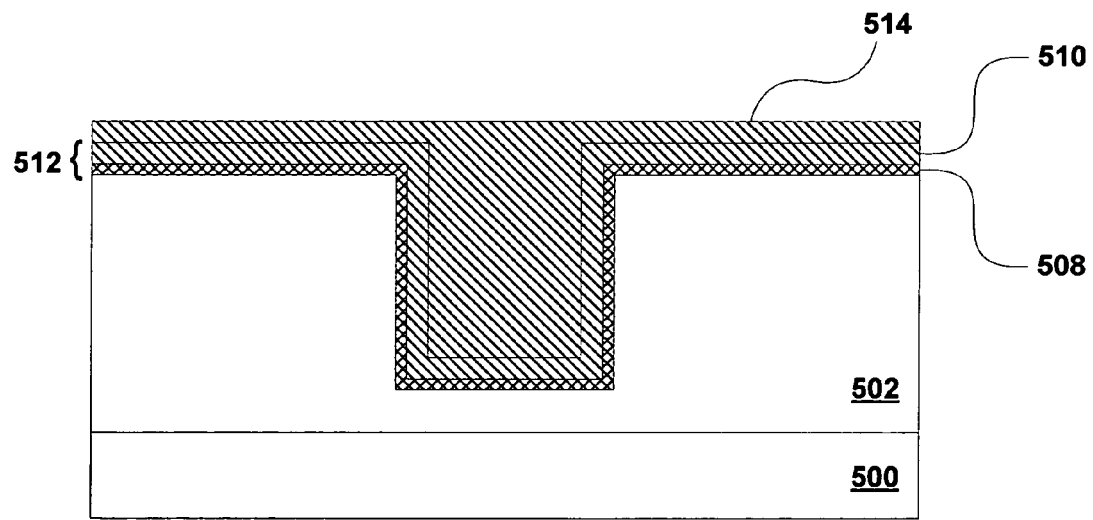
FIG._5D

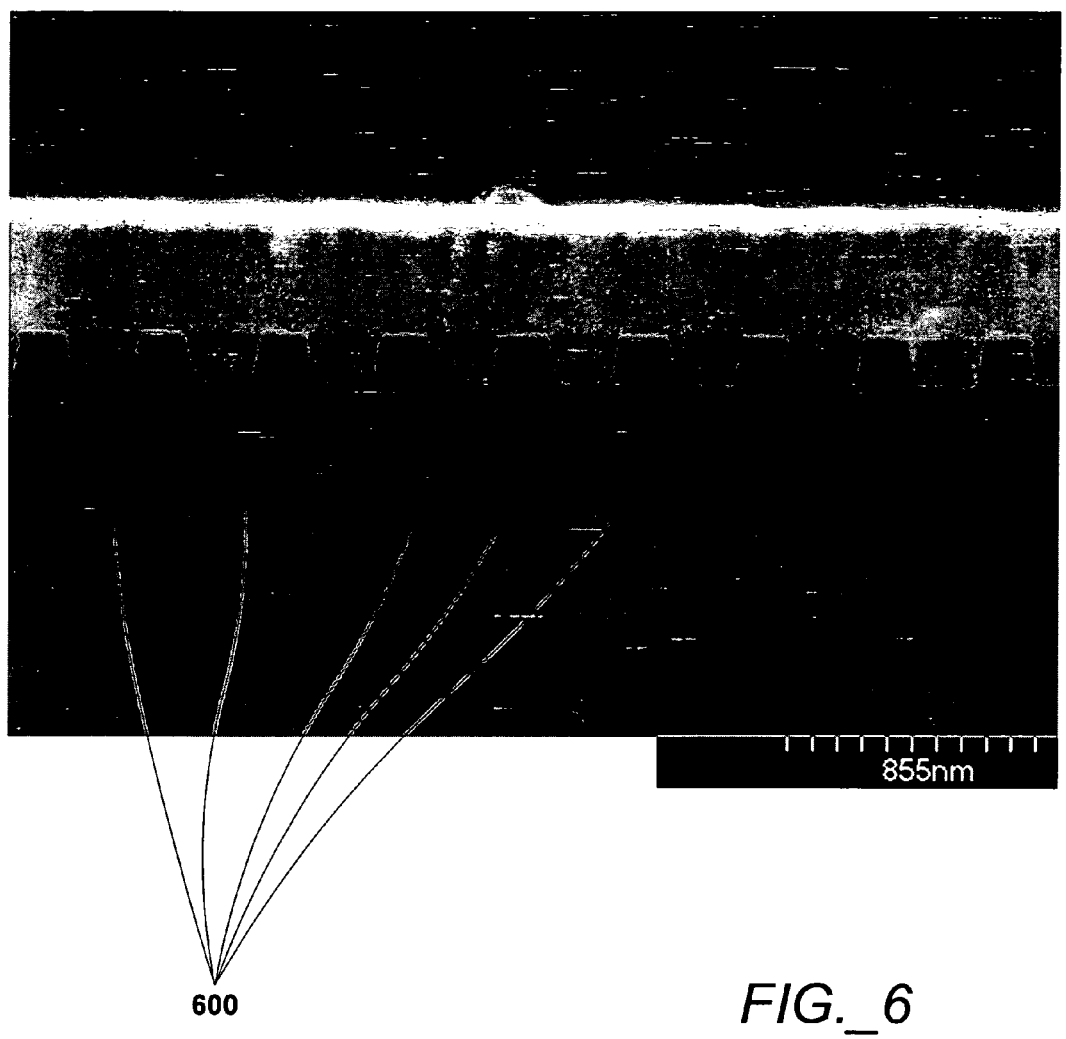
FIG._6

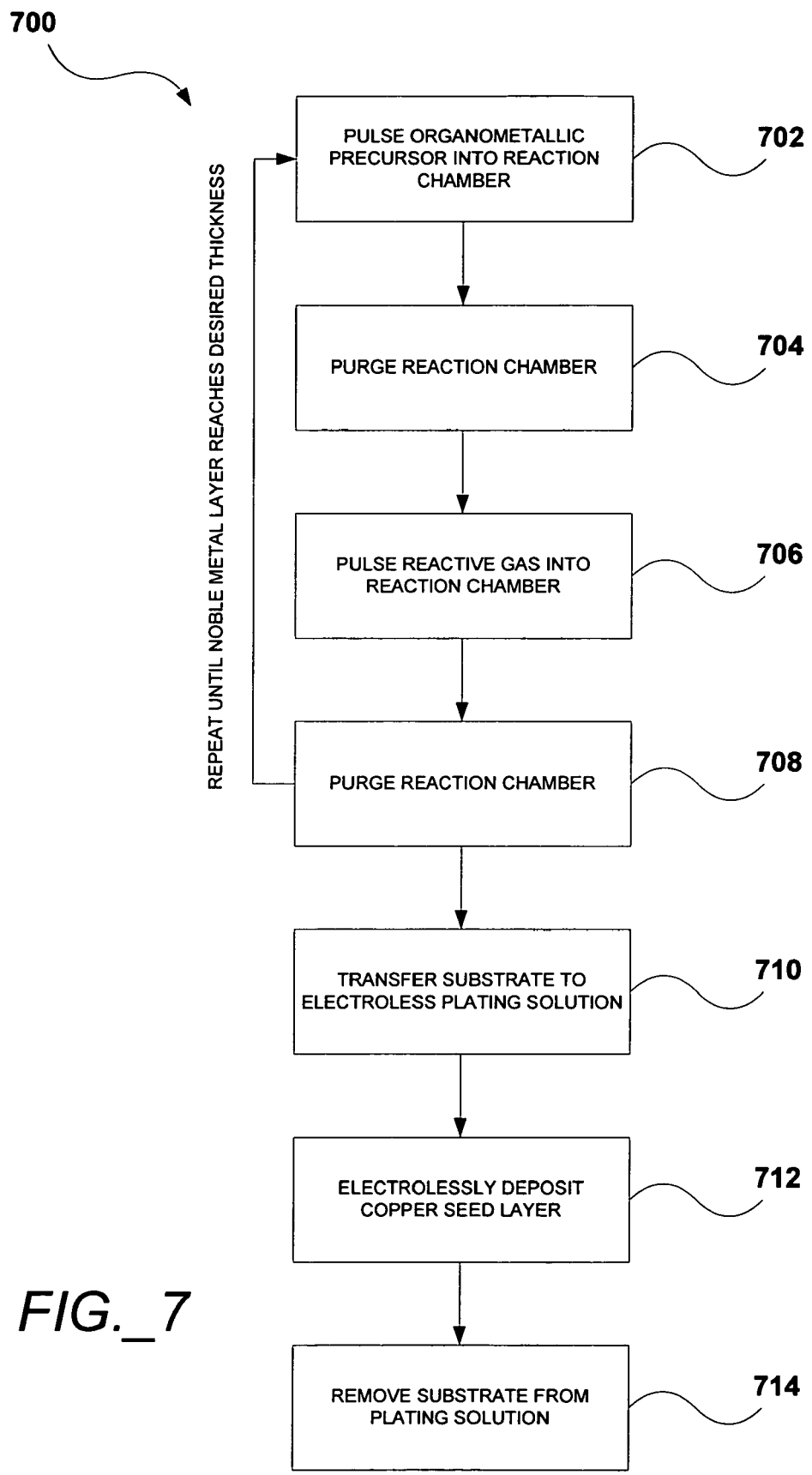
FIG._7

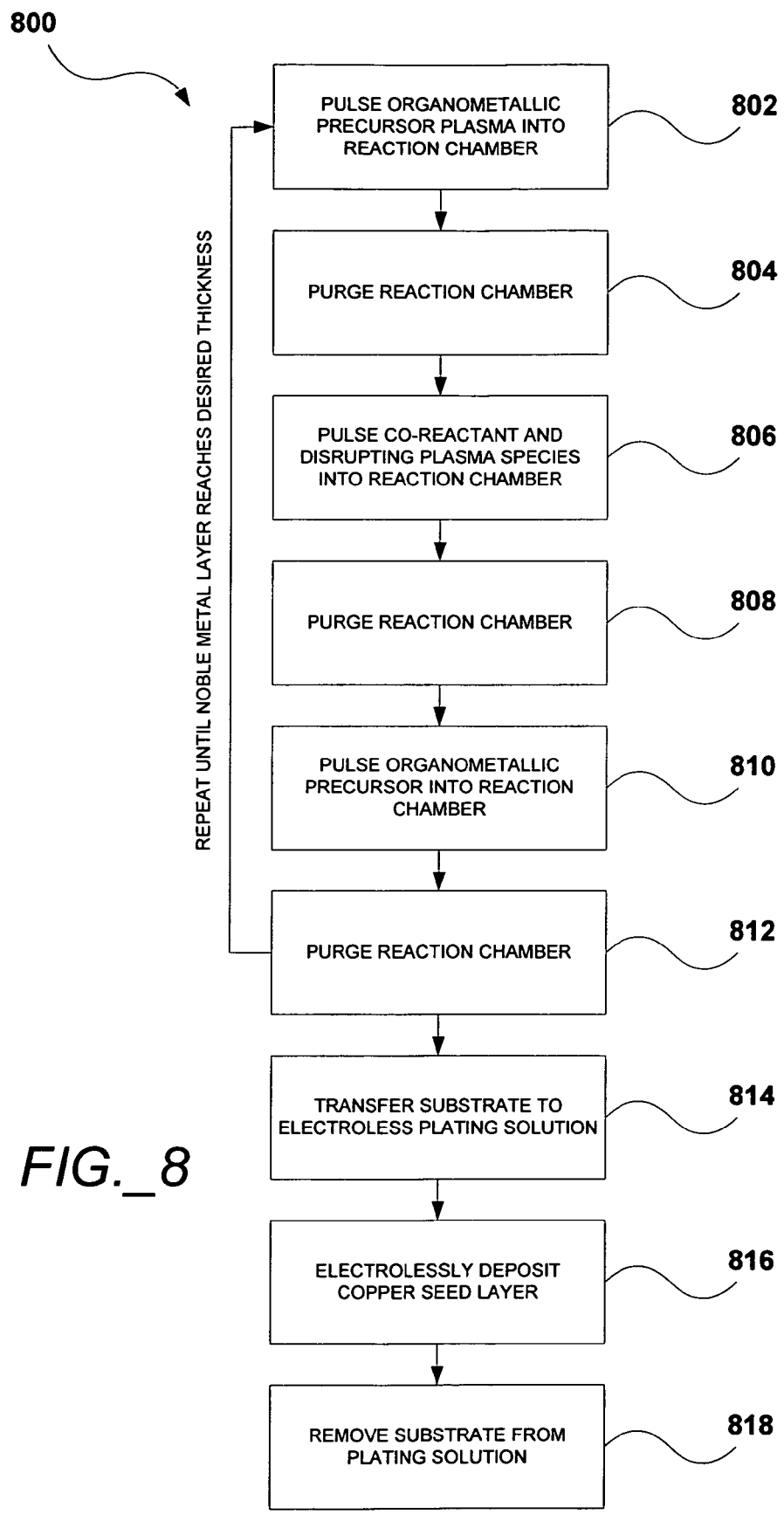
FIG._8

ELECTROLESS TREATMENT OF NOBLE METAL BARRIER AND ADHESION LAYER

BACKGROUND

In the manufacture of integrated circuits, copper interconnects are generally formed on a semiconductor substrate using a copper dual damascene process. Such a process begins with a trench being etched into a dielectric layer and filled with a barrier layer, an adhesion layer, and a seed layer. A sputtering process may be used to deposit a tantalum nitride (TaN) barrier layer and a tantalum (Ta) or ruthenium (Ru) adhesion layer (i.e., a TaN/Ta or TaN/Ru stack) into the trench. The TaN barrier layer prevents copper from diffusing into the underlying dielectric layer. The Ta/Ru adhesion layer enables subsequently deposited metals to nucleate on the TaN barrier layer. This may be followed by a sputtering process to deposit a copper seed layer into the trench and an electroplating process to fill the trench with copper metal.

As device dimensions scale down, the trench becomes more narrow, thereby causing the aspect ratio of the trench to become more aggressive. This gives rise to issues such as trench overhang during the two copper deposition processes. Trench overhang eventually causes the trench opening to become pinched-off, resulting in inadequate gapfill and void formation. Additionally, as trenches decrease in size, the ratio of barrier metal to copper in the overall interconnect structure increases, thereby increasing the electrical line resistance and RC delay of the interconnect.

One approach to addressing these issues is to reduce the thickness of the TaN/Ta or TaN/Ru stack, for instance, by replacing the stack with a noble metal layer. This widens the available gap for subsequent metallization and increases the final copper volume fraction. Unfortunately, voids may still form when using current interconnect fabrication procedures with noble metal barrier/adhesion layers.

BRIEF DESCRIPTION OF THE DRAWINGS

FIGS. 1A to 1E illustrate a conventional damascene process for fabricating copper interconnects.

FIGS. 2A to 2C illustrate the fabrication of a copper interconnect using a noble metal adhesion and barrier layer.

FIG. 3 is a SEM image of actual copper interconnects formed using the process described in FIGS. 2A to 2C.

FIG. 4 is a method of forming a copper interconnect using an EL-Cu enhanced noble metal layer.

FIGS. 5A to 5E illustrate various structures that are formed while carrying out the process of FIG. 4.

FIG. 6 is a SEM image of actual copper interconnects formed using the process described in FIG. 4.

FIG. 7 is a process cycle for forming an EL-Cu enhanced noble metal layer in accordance with an implementation of the invention.

FIG. 8 is a process cycle for forming an EL-Cu enhanced amorphous noble metal layer in accordance with an implementation of the invention.

DETAILED DESCRIPTION

Figure 5E:
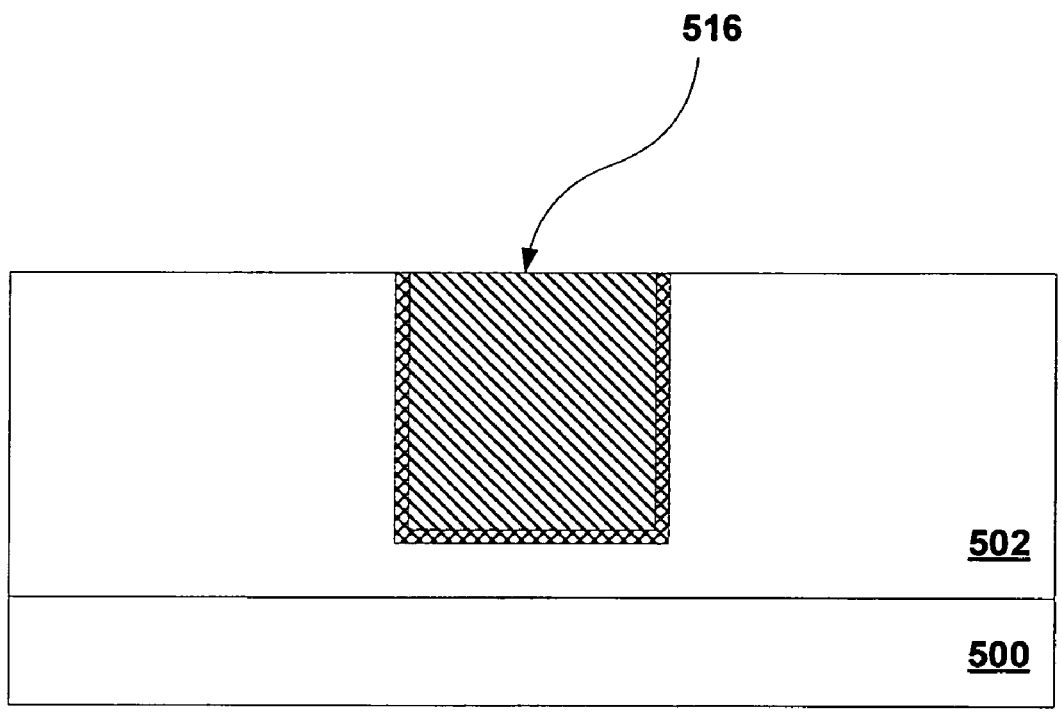

Described herein are systems and methods of using an electroless-copper enhanced noble metal layer as a tandem barrier and adhesion layer. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention include an ultra thin noble metal layer that has undergone an electroless (EL) copper seed enhancement and functions as both a copper barrier layer and a copper adhesion layer. For purposes of this disclosure, the term "noble metal" will refer to any of at least the following metals: iridium (Ir), platinum (Pt), palladium (Pd), rhodium (Rh), osmium (Os), gold (Au), silver (Ag), rhenium (Re), ruthenium (Ru), tungsten (W), and nickel (Ni). Additional metals that may be classified as conventional noble metals may be used as well. In various implementations, the thickness of the noble metal layer may range from 3 Angstroms (Å) to 50 Å.

For reference, FIGS. 1A to 1E illustrate a conventional damascene process for fabricating copper interconnects on a semiconductor wafer. FIG. 1A illustrates a substrate 100, such as a semiconductor wafer, that includes a trench 102 that has been etched into a dielectric layer 104. The trench 102 includes a gap 106 through which metal may enter during metallization processes.

FIG. 1B illustrates the trench 102 after a conventional barrier layer 108 and a conventional adhesion layer 110 have been deposited. The barrier layer 108 prevents copper metal from diffusing into the dielectric layer 104. The adhesion layer 110 enables copper metal to become deposited onto the barrier layer 108. The barrier layer 108 is generally formed using a material such as tantalum nitride (TaN) and is deposited using a PVD process. The barrier layer 108 may be around 0.5 Angstroms (Å) to 10 nanometers (nm) thick, although it is generally around 5 nm thick. The adhesion layer 110 is generally formed using a metal such as tantalum (Ta) or ruthenium (Ru) and is also deposited using a PVD process. The adhesion layer 110 is generally around 0.5 nm to 10 nm thick.

After the adhesion layer 110 is formed, the conventional damascene process of FIG. 1 uses two independent deposition processes to fill the trench 102 with copper metal. The first deposition process is a PVD process that forms a non-conformal copper seed layer. The second deposition process is a plating process, such as an electroplating (EP) process or an electroless plating (EL) process, that deposits a bulk copper layer to fill the trench 102.

FIG. 1C illustrates the trench 102 after a conventional copper seed layer 112 has been deposited onto the adhesion layer 110 using a PVD process. The copper seed layer 112 enables or catalyzes a subsequent plating process to fill the interconnect with copper metal. FIG. 1D illustrates the trench 102 after an EP or EL copper deposition process has been carried out. Copper metal 114 enters the trench through the gap 106 where, due to the narrow width of the gap 106, issues such as trench overhang and pinching off of the trench opening may occur that lead to defects. For instance, as shown in FIG. 1D, trench overhang may occur that pinches off the opening of the trench 102, creating a void 116 that will appear in the final interconnect structure.

FIG. 1E illustrates the trench 102 after a chemical mechanical polishing (CMP) process is used to planarize the deposited copper metal 114. The CMP results in the formation of a metal interconnect 118. As shown, the metal interconnect 118 includes the void 116 that was formed when the available gap 106 was too narrow and the resulting trench overhang pinched off the trench opening. Furthermore, a substantial portion of the metal interconnect 118 comprises Ta and/or Ru from the adhesion layer 110 and the barrier layer 108.

FIGS. 2A to 2C illustrate an improvement to the fabrication process shown in FIGS. 1A to 1E. Starting with FIG. 2A, a semiconductor wafer 200 is shown that includes a dielectric layer 202 and a trench 204 that has been etched into the dielectric layer 202. Turning to FIG. 2B, a noble metal layer 206 is deposited within the trench 204. As will be described in more detail below, the noble metal layer 206 replaces the conventional TaN/Ta or TaN/Ru stack and functions as both a barrier to copper diffusion and as an adhesion layer for copper deposition.

Next, as shown in FIG. 2C, a bulk copper layer 208 is deposited directly onto the noble metal layer 206 to fill the trench 204 with copper. The bulk copper layer 208 is deposited using a conventional electroplating process.

Unfortunately, random voids 210 may appear within copper interconnects that are fabricated by directly electroplating the bulk copper layer 208 onto the noble metal layer 206. A real life example is shown in FIG. 3, which is a scanning electron microscope (SEM) image of actual copper interconnects 300 that have been formed using the fabrication process detailed in FIGS. 2A to 2C. As shown, voids 210 still appear within a significant number of the copper interconnects 300.

To overcome the above-mentioned issues with conventional metal interconnects, implementations of the invention provide a damascene process that widens the gap available for metallization and enables a void-free bulk copper deposition. To widen the gap available for metallization, implementations of the invention utilize an ultra thin noble metal layer in place of the conventional, two-layer, TaN/Ta stack. The single noble metal layer functions as both a barrier to copper diffusion and as an adhesion layer for copper deposition. And to enable a void-free bulk copper deposition, implementations of the invention enhance the ultra thin noble metal layer using an electroless copper seed deposition process. The resulting electroless-copper (EL-Cu) enhanced noble metal layer provides a thinner barrier and adhesion layer that widens the trench gap available for metallization and enables a void-free copper deposition in narrower trenches with aggressive aspect ratios.

FIG. 4 is a method 400 of forming a copper interconnect using an EL-Cu enhanced noble metal layer in place of conventional barrier and adhesion layers, in accordance with an implementation of the invention. FIGS. 5A to 5E illustrate various structures that are formed while carrying out the processes of the method 400. For clarity, the method 400 of FIG. 4 will be described in association with the structures shown in FIGS. 5A to 5E.

First, a semiconductor substrate is provided that includes a dielectric layer (process 402 of FIG. 4). The dielectric layer provides insulation between electrical components. As semiconductor device dimensions decrease, electrical components such as interconnects must be formed closer together. This increases the capacitance between components with the resulting interference and crosstalk degrading device performance. To reduce the interference and crosstalk, dielectric materials with lower dielectric constants (i.e., low-k dielectric materials) are used to provide insulation between electrical components. Common dielectric materials that may be used in the dielectric layer include, but are not limited to, oxides such as silicon dioxide ($SiO_2$) and carbon doped oxide (CDO), organic polymers such as perfluorocyclobutane (PFCB), or fluorosilicate glass (FSG).

The dielectric layer is patterned to include at least one trench for use in forming a copper interconnect by way of a damascene process (process 404). Conventional photolithography techniques may be used to etch the trench into the dielectric layer. As is well known in the art, one photolithography technique includes depositing a photoresist material onto the dielectric layer, exposing the photoresist material to ultraviolet radiation using a patterned mask, developing the photoresist material, etching the dielectric layer, and removing the photoresist material. The photoresist material that remains after development functions as a mask to allow only selected portions of the dielectric layer to be etched, thereby forming structures such as the trench.

Turning to FIG. 5A, a semiconductor wafer 500 is shown that includes a dielectric layer 502. A trench 504 is etched into the dielectric layer 502 and includes a gap 506 through which metal may enter the trench 502 during one or more metallization processes.

Next, a noble metal layer is deposited within the trench (process 406). As mentioned above, the noble metal layer replaces the conventional TaN/Ta stack. Deposition processes such as atomic layer deposition (ALD), chemical vapor deposition (CVD), or physical vapor deposition (PVD) may be used to deposit the noble metal layer. In some implementations of the invention, the noble metal layer may be an ultra-thin film that comprises Ir, Os, or Re metal. In further implementations of the invention, the noble metal layer may be an ultra-thin film formed from metals that include, but are not limited to, Pt, Pd, Rh, Au, Ag, Ru, W, and Ni. The thickness of the noble metal layer may range from 3 Å to 50 Å, with a thickness of less than 20 Å being preferred. In some implementations, the density of the noble metal layer may range from around 5 grams per cubic centimeter ($g/cm^3$) to around 19 $g/cm^3$ or even greater. The noble metal layer may be deposited directly upon the dielectric layer.

FIG. 5B illustrates a single noble metal layer 508 formed within the trench 504. The single noble metal layer 508 functions as both a barrier to copper diffusion and as an adhesion layer for copper deposition, eliminating the need for the TaN/Ta stock. The noble metal layer 508 enables a thinner barrier/adhesion layer that widens the trench gap available for metallization.

The noble metal layer is then enhanced by applying an electroless deposition process for a copper seed layer to the noble metal layer (process 408). During the electroless (EL) plating process, the copper metal nucleates on the surface of the noble metal layer to generate a thin copper seed layer, thereby forming an EL-Cu enhanced noble metal layer. In implementations, the thin copper seed layer may range from 5 Å to 100 Å. The copper seed layer enables or catalyzes a subsequent electroplating (EP) process to fill the interconnect with void-free copper metal.

FIG. 5C illustrates the trench 504 after an electroless copper seed layer 510 has been deposited onto the noble metal layer 508, thereby forming an EL-Cu enhanced noble metal layer 512. As shown in FIG. 5C, after the EL-Cu enhanced noble metal layer 512 is formed, the gap 506 available for metallization is still significantly wider than the narrow gap 106 created during the conventional damascene process (see FIG. 1C).

In accordance with the invention, an electroplating process is then carried out to deposit a bulk copper layer over the EL-Cu enhanced noble metal layer that fills the trench with copper (process 410). The copper metal enters the trench through the gap where, due to the relatively larger width of the gap, issues such as trench overhang are reduced or eliminated. The use of the EL-Cu enhanced noble metal layer substantially reduces or eliminates the formation of voids in the bulk copper layer within the trench.

FIG. 5D illustrates the trench 504 after a bulk copper layer 514 has been deposited onto the EL-Cu enhanced noble metal layer 512 using an EP process. As shown, the bulk copper layer 514 fills the trench 504 without voids.

Finally, a chemical mechanical polishing (CMP) process may be used to planarize the deposited copper metal and finalize the copper interconnect structure (process 412). FIG. 5E illustrates the formation of a copper interconnect 516 after the CMP process is used to planarize the deposited bulk copper layer 514, as well as portions of the EL-Cu enhanced noble metal layer 512.

FIG. 6 is an SEM image of actual copper interconnects 600 that have been formed in accordance with the fabrication process of FIG. 4 using the EL-Cu enhanced noble metal layer. As shown, voids do not appear within any of the copper interconnects 600 shown in the SEM image.

In accordance with implementations of the invention, the noble metal layer may be formed using one or more organometallic precursors in a CVD process, for instance, in an ALD process. The organometallic precursor contains the specific noble metal that is desired for the noble metal layer. The deposition of noble metals using ALD or CVD methods has been previously demonstrated and noble metals may be deposited as pure materials due to the catalytic nature of the metal.

The organometallic precursor used in the ALD or CVD process to form a noble metal layer may take the form of a carbonyls, allyls, beta-diketonates, aryls, metallocenes, alkyls, alkenes, hydrides, amides, arenes, halides, pentadienyls, as well as combinations thereof. Other forms of noble metal containing organometallic precursors that are suitable for ALD and CVD processes may be used as well.

For instance, if the desired noble metal is Ir, organometallic precursors that may be used in an ALD or a CVD process include, but are not limited to, chlorocarbonylbis(triphenylphosphine)Ir, chloro-1,5-cyclooctadieneiridium, 1,5-cyclooctadiene(acetylacetonato)Ir, dicarbonylacetonatoiridium, hydrocarbonyltris(triphenylphosphine)Ir, Ir-acetylacetonate, $Ir_4(CO)_{12}$, $Ir_6(CO)_{16}$, $Ir(allyl)_3$, (methylcyclopentadienyl)(1,5-cyclooctadiene)Ir, tris(norbornadiene)(acetylacetonato)Ir, $Ir(CO)_2Cl_4$, $Ir(CO)_2Br_4$, $IrI(CO)_3$, $HIr(CO)_4$, $CpIr(CO)_2$, Pyrrolyl-Ir—$(CO)_2$—Cl, and ligand variations thereof including, but not limited to, allyls, cyclohexadienyl, indenyl, and pentamethylCp (where Cp=cyclopentadienyl). Further Ir containing organometallic precursors include, but are not limited to, $(cod)IrCp$, $Ir(cod)_2Br$, $CpIr(Pyrrolyl)_3$, hexadienyl-Ir(Cp), $Ir(allyl)pyrroryl_2$, and $IrH_5(PEt_3)_2$.

If the desired noble metal is Rh, organometallic precursors that may be used in an ALD or a CVD process include, but are not limited to, $Rh_3(CO)_{12}$, $RhBr_3(CO)$, $RhI_3(CO)$, $RhCl_3(CO)$, $Rh(CO)_2(NH_2)Cl$, $Rh(CO)_3I$, $Rh(CO)_3Br$, $Rh(CO)_3Cl$, $Rh(allyl)(CO)_2$, and cyclohexadienyl-Rh—$(CO)I_2$. Further Rh containing organometallic precursors include, but are not limited to, $Rh(allyl)(CO)_2$, allyl-$Rh(PF_3)_3$, $CpRh(allyl)Cl$, $Rh(allyl)_3$, cod-Rh-allyl, $Rh_2(allyl)_4Cl_2$, $Rh(allyl)_4(OAc)_2$, $Rh(C_2H_4)_4Br_2$, $CpRh(C_2H_4)PMe_3$, $(cod)Rh(Cp)$, $(Cp)Rh(acac)Cl$, $RhCp_2I_4$, $RhCp_2Br_4$, and $Cp-Rh(Cl)_2(PPh_3)$.

If the desired noble metal is Pt, organometallic precursors that may be used in an ALD or a CVD process include, but are not limited to, $Pt(CO)_2Cl$, $Pt(CO)_2Br$, $PtMe_2(CO)_2$, $Pt(PMe_3)(CO)Cl_2$, Pt-cyclohexadienyl-(CO)—I, $Pt(allyl)_2$, $Pt_2I_2(allyl)_2$, $Pt_2Br_2(allyl)_2$, allyl-Pt—$(PPh_3)Cl$, $Pt(OH)_2Me_2$, $Cl_2PtC_2H_4(PPh_3)$, $Me_4Pt(PMe_2Ph)_2$, $(MeOCH_2C_2H_4)Pt(PMe_2Ph)_2$, and $(Me)_2Pt(PMePh_2)_2$.

If the desired noble metal is Pd, organometallic precursors that may be used in an ALD or a CVD process include, but are not limited to, $PdI_2(CO)_2$, $PdCl_2(CO)_2$, and $Pd(CO)_2(C_4F_6)$.

If the desired noble metal is Os, organometallic precursors that may be used in an ALD or a CVD process include, but are not limited to, $OS(CO)_2(NO)_2$, $OS(CO)_4Br_2$, $OS(CO)_5$, Cp-Os—$(CO)_2$—I, Cp-Os—$(CO)_2$—Cl, Cp-Os—$(CO)_2$—Br, $SiMe_3$-Os—$(CO)_4$—I, and $SiMe_3$-Os—$(CO)_4$—Br.

As will be apparent to those of ordinary skill in the art, in the precursor lists provided above, Cp represents cyclopentadienyl, Me represents methyl, Et represents ethyl, Pr represents propyl, Ph represents phenyl, allyl represents $C_3H_5$, and acac represents acetylacetonato.

In implementations of the invention, the above listed noble metal precursors may be co-deposited with one or more reactive gases, such as silane or methane, to saturate grain boundaries and densify the noble metal layers. Other reactive gases that may be used include, but are not limited to, primary silanes, secondary silanes, tertiary silanes, quaternary silanes, primary alkyl amines, secondary alkyl amines, tertiary alkyl amines, methane, $BH_3$, $B_2H_6$, primary alkyl alanes, secondary alkyl alanes, tertiary alkyl alanes, phosphine, germanes, dihalides, and hydrohalide acids. The deposited noble metal layers may also be treated, for instance annealed, post deposition to saturate grain boundaries with light elements of interest, such as carbon, nitrogen, oxygen, or boron.

FIG. 7 is a process cycle 700 for forming an EL-Cu enhanced noble metal layer in accordance with an implementation of the invention. The process cycle 700 begins with a semiconductor substrate that is within a CVD/ALD reaction chamber. The process cycle introduces one or more organometallic precursor pulses into the reaction chamber proximate to the semiconductor wafer (702). The organometallic precursor contains the desired noble metal and may be one or more of the above-listed noble metal precursors. The reaction chamber may be at a pressure that ranges from around 0.05 Torr to around 2 Torr, with a pressure of around 0.25 Torr being used often. The precursor may have a temperature that ranges from around 80° C. to around 300° C. In most implementations, the ALD or CVD deposition may be carried out at a precursor temperature around or less than 200° C. The semiconductor substrate may be heated to a temperature that may range from around 150° C. to around 600° C., with a substrate temperature between 225° C. and 350° C. being most common.

In some implementations, the organometallic precursor may be pulsed into a reaction chamber at a flow rate that ranges up to 5 standard liters per minute (SLM) for a time duration that ranges from 0.1 seconds to 5 seconds. A carrier gas such as nitrogen, argon, or helium may be used to transport the organometallic precursor into the reaction chamber. Accordingly, it may be the carrier gas that has the flow rate that ranges up to 5 SLM. Other implementations may use different flow rates and time durations.

The process cycle 700 continues by purging the reaction chamber with an inert gas such as helium (He), $N_2$, or forming gas (704). The purge may last for a time duration that ranges from 0.1 seconds to 10 seconds. Next, a reactive gas is pulsed into the reaction chamber proximate to the semiconductor wafer (706). Reactive gases that may be used in the process cycle 700 include any of the previously mentioned reactive gases, as well as hydrogen ($H_2$), silane, methane, $B_2H_6$, oxygen ($O_2$), $NH_3$, forming gas (e.g., 5% $H_2$ in $N_2$), and mixtures thereof. The reactive gas pulse may last for a time duration that ranges from 0.1 seconds to 5 seconds, with a time period of around 0.5 seconds being used in some implementations. The reactive gas reacts with the organometallic precursor to form a noble metal layer directly on a dielectric layer of the semiconductor substrate. In some implementations, the flow rate for the reactive gas pulse may range up to 0.1 standard cubic centimeters per minute (SCCM).

A final purge may take place for a time duration of around 0.1 seconds to 10 seconds (708). At this point, one cycle of the CVD/ALD process has been completed and the process stages 702 to 708 may be repeated until the desired film properties and thickness are generated.

Once the noble metal layer is formed with the desired thickness, the substrate is transferred to an electroless plating solution (710). The EL plating solution generally includes water, a water soluble compound containing copper (e.g., a copper salt), a complexing agent (e.g., an organic acid or amine) that prevents chemical reduction of the copper ions in solution while permitting selective chemical reduction on the noble metal layer, and a chemical reducing agent for the copper ions (e.g., hypophosphite, dimethylaminoborane (DMAB), formaldehyde, hydrazine, or borohydride). Additionally, the EL plating solution may include a buffer (e.g., boric acid, an organic acid, or an amine) for controlling pH and various optional additives, such as solution stabilizers (e.g., pyridine, thiourea, or molybdates), surfactants (e.g., a glycol), and wetting agents. It is to be understood that the composition of a plating solution will vary depending on the desired plating outcome.

When the substrate is submerged in the EL plating solution, the electroless deposition of copper is carried out (712). As is known to those of skill in the art, electroless plating is a metal deposition process in which the metal, such as copper, begins in solution and a controlled chemical reduction reaction is used to deposit the copper metal onto a substrate, such as the noble metal layer. The electroless process is autocatalytic as the copper metal being deposited catalyzes the chemical reduction reaction without the need for an external electric current. Electroless plating is a selective deposition and occurs at activated surfaces on the substrate, i.e., locations that have a nucleation potential for an electroless plating solution. The noble metal layer provides this activated surface.

The electroless plating process continues until the copper seed layer that is formed reaches a desired thickness. For instance, in implementations of the invention, the EL plating process continues until the copper seed layer is a thickness between 5 Å and 100 Å. Once the desired thickness is reached, the substrate is removed from the EL plating solution (714) and an EL-Cu enhanced noble metal layer has been formed.

As will be appreciated by those of skill in the art, there are different techniques available for electrolessly plating copper into the noble metal layer. In one implementation, a typical electroless plating bath may be used that includes a copper salt (e.g., copper sulfate), a non-polymer complexing agent, a reducing agent, and a surfactant. The electroless deposition process may take place at a basic pH level (e.g., a pH level between pH 10 and pH 14) and at a temperature between around 50° C. and 100° C. The noble metal layer may be immersed in the electroless plating bath for the time required to achieve the desired thickness, for example, a time period between 10 seconds and 120 seconds.

In another implementation of the invention, a palladium-immobilization process (PIP) may be used to enable an electroless deposition process. In a conventional PIP process, the substrate containing the noble metal layer may first be cleaned to remove impurities, contaminants, and/or oxides. The cleaning solution used may be an alkaline solution or a pure water rinse. The cleaning solutions may contain surfactants (e.g. polyoxyethylene derivatives), phosphates, and/or carbonates in alkaline media. These cleaning solutions tend to make the semiconductor substrate more hydrophilic and tend to remove loose particles due to the fluid motion on the wafer.

After the cleaning process, the substrate may be immersed into a solution containing both a coupling agent and a palladium catalyst. The palladium becomes affixed to the noble metal layer by way of the coupling agent. The coupling agent may include a silane group and a nitrogen group, for instance, the coupling agent may be an azo-silane molecule. The silane group bonds to the noble metal layer and the azo group bonds to the palladium. This results in the formation of a layer of metal catalyst ions. Next, the substrate may be immersed in an activating solution that contains a reducing agent. The reducing agent activates the palladium, which now becomes covalently bonded to the coupling agent, forming a monolayer of palladium on the surface of the noble metal layer.

Finally, the substrate may then be immersed in an electroless plating bath and an electroless deposition process may be carried out to deposit copper over the palladium. The palladium serves as a nucleation site for the electroless deposition to occur. The plating bath may contain a copper salt (e.g., copper sulfate), a polymer-containing complexing agent, a reducing agent, and a surfactant. The electroless deposition process may take place at a basic pH level (e.g., a pH level between pH 10 and pH 14) and at a temperature between around 50° C. and 100° C. The noble metal layer may be immersed in the electroless plating bath for the time required to achieve the desired thickness, for example, a time period between 10 seconds and 120 seconds.

In further implementations of the invention, the above listed noble metal precursors may be used in a plasma enhanced process to generate an EL-Cu enhanced amorphous noble metal layer. One advantage of using an amorphous noble metal layer in lieu of a crystalline noble metal layer is that the barrier layer properties of the noble metal layer are enhanced. In particular, the copper metal that is deposited atop the noble metal layer is disfavored from diffusing along the crystalline grain boundaries.

The plasma enhanced process for depositing the noble metal layer introduces one or more plasma pulses into a reaction chamber during the ALD or CVD deposition process. The plasma pulses may be introduced with the noble metal precursor, a co-reactant gas, or both. The plasma pulses produce an energetic species that disrupt the formation of long range order within the noble metal layer.

FIG. 8 illustrates an implementation of a process cycle 800 for producing an EL-Cu enhanced amorphous noble metal layer in accordance with implementations of the invention. The process cycle 800 pulses an organometallic precursor into the reaction chamber for adsorption onto a substrate surface, for example, a dielectric layer on a semiconductor substrate (802). The organometallic precursor may be pulsed into the chamber with the use of a direct or remote plasma source that may be pulsed. As described above, the reaction chamber may be at a pressure that ranges from around 0.05 Torr to around 2 Torr, the precursor may have a temperature that ranges from around 80° C. to around 350° C., and the substrate temperature may range from around 150° C. to around 600° C. Nitrogen, argon, or helium may be used as the carrier gas with a flow rate up to 5 SLM. The organometallic precursor pulse may range from 0.1 seconds to 5 seconds in the presence or absence of plasma. The plasma may be struck in the presence of hydrogen, nitrogen, argon, helium, or mixtures thereof. Other implementations may use different flow rates and time durations.

The reaction chamber may then be purged, for instance, with an inert gas such as He, $N_2$, neon (Ne), argon (Ar), krypton (Kr), or forming gas (804). The purge may last for a time duration that ranges from 0.1 seconds to 10 seconds.

The process cycle 800 may then pulse a co-reactant species and a plasma species, referred to herein as a disrupting plasma species, into the reaction chamber for adsorption onto the substrate surface (806). The co-reactant species may consist of any of the previously mentioned reactive gases. The disrupting plasma species may include, but is not limited to, phosphorous (P), nitrogen (N), oxygen (O), carbon (C), boron (B), hydrogen (H), argon (Ar), or helium (He). The disrupting plasma introduces an energetic species that tends to disrupt the formation of long range order (e.g., crystalline order) in the deposited noble metal layer. Process parameters including but not limited to plasma pulse duration, plasma power modulation, entering plasma gases, deposition rate (via precursor or co-reactant flow rate), pressure, temperature, and other parameters may be used to effect the resultant noble metal layer and/or disrupt its long range order. In some implementations, a capacitively-coupled RF (e.g., 13.56 MHz) plasma source may be used.

The reaction chamber may then be purged again (808) and the process cycle 800 may introduce another pulse of the organometallic precursor into the reaction chamber for adsorption onto the substrate surface (810). This may be followed by another purge of the reaction chamber (812). In accordance with implementations of the invention, the process stages 802 to 812 may be repeated as necessary until the desired film properties and thickness are generated, for instance, a thickness between around 3 Å and around 50 Å.

Once the noble metal layer has reached the desired thickness, the substrate is transferred to an electroless plating solution (814) and the electroless deposition of copper is carried out (816). The electroless plating process continues until the copper seed layer that is formed reaches a desired thickness, for instance, a thickness between 5 Å and 100 Å. The substrate is then removed from the EL plating solution (818) with the newly formed EL-Cu enhanced amorphous noble metal layer.

In implementations of the invention, the use of a plasma disrupting species enables the deposition of noble metal layers at relatively low temperatures. For instance, temperatures below 150° C. may be used during the deposition of the amorphous noble metal layer. Furthermore, the use of lower temperatures further contributes to disrupting any long range order in the noble metal layer.

As may be known to those of skill in the art, the use of a plasma disrupting species may tend to form an amorphous noble metal layer that is metastable. To reduce or eliminate the potential for instability, light elements such as P, N, C or B may be used as these elements tend to disrupt the lattice permanently. In implementations of the invention, to avoid the formation of an alloyed metal layer, the light element may be pulsed at sufficiently low concentrations that allow for interstitial solubility, rather than being pulsed in a continuous manner.

In another implementation, light elements as described above (e.g., P, N, C or B) may be deposited such that the light element forms one or more layers that are within or that encase one or more pure noble metal layers to preserve the amorphous quality. For instance, the light elements layer may be formed at the center of the noble metal layer or at one or more interfaces of the noble metal layer. The metal layer may therefore be composed of several layers with varying levels of the light element that function to substantially prevent further processing from recrystallizing the noble metal layer.

In accordance with another implementation of the invention, the noble metal layer may be formed such that its density varies along the deposition area. In some implementations, this may be accomplished by treating the metal layer with a directed plasma with the option of using a biased substrate. The bias conditions may range from 10V to 100V, with a typical bias being around 60V. For example, during a process to form the noble metal layer, after an organometallic precursor pulse and a co-reactant species pulse, a directional plasma burst may be used to lower the density of the film at locations such as the field or a via. This may be used to preferentially etch these areas for conductivity, polishing, or patterning improvements. This process is performed prior to the EL enhancement with copper.

In further implementations, the opposite effect may be effected to create a denser film at locations such as the field or a via. The may result in the deposition of a non-conformal noble metal layer due to the increased deposition rates at certain locations. The process of increased densification of certain locations allows a thinner noble metal layer to be used, for instance, a thinner noble metal layer may be used in a via to enable higher via conductivity and shorter polishing times.

Densification of the noble metal layer may be accomplished in different ways depending on the deposition conditions. For noble metal layers deposited using a PVD process, the layer density is usually near bulk, but may be changed by treating the noble metal layer with ions of an inert gas (e.g., Ar, Xe, or $N_2$) at energies just below those used for sputtering conditions. In some implementations, ion beam energies between 25 eV and 100 eV may be produced using beam currents that are between 20V per beam to 75V per beam. For noble metal layers deposited using an ALD process, an increase in power density from 0.001 $W/cm^2$ to 10 $W/cm^2$ can increase the density of the noble metal layer. In addition, the use of a nitrogen plasma can also result in a more dense noble metal layer.

In further implementations of the invention, after the noble metal layer is formed and prior to the EL copper deposition, any oxides, water, or other impurities that may adversely effect the subsequent copper metallization process may be removed. In one implementation, the oxides may be removed by exposing the noble metal layer to a reducing atmosphere of hydrogen gas and nitrogen gas.

Implementations of the invention therefore enable a void-free copper interconnect structure to be formed using the EL-Cu enhanced noble metal layer of the invention. This generates an integrated interconnect stack composed of (top down) copper-iridium-dielectric. The need for a TaN barrier layer and a Ta or Ru adhesion layer is eliminated and the noble metal layer provides a thinner barrier/adhesion layer that enables smaller devices to be formed. The interconnect structure of the invention has a higher concentration of copper metal relative to conventional interconnects, resulting in low resistivity and improved RC delay.

As described above, the noble metal layer of the invention enables copper gapfill in backend applications while using less process steps and less tooling than conventional methods that employ a TaN/Ta stock. The noble metal layers are relatively thin and are capable of conformally depositing on aggressive geometries, using novel organometallic precursors for ALD and CVD processes.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
providing a semiconductor substrate in a reaction chamber, wherein the semiconductor substrate includes a trench etched into a dielectric layer;
pulsing an organometallic precursor containing a noble metal into the reaction chamber proximate to the semiconductor substrate;
pulsing a disrupting plasma species into the reaction chamber proximate to the semiconductor substrate;
pulsing a co-reactant species into the reaction chamber proximate to the semiconductor substrate, wherein the organometallic precursor, the disrupting plasma species, and the co-reactant species form an amorphous noble metal layer directly on the dielectric layer;
placing the semiconductor substrate in an electroless plating bath;
using an electroless plating process to deposit a copper seed layer onto the amorphous noble metal layer; and
removing the semiconductor substrate from the plating bath.

2. The method of claim 1, wherein the organometallic precursor is in plasma form.

3. The method of claim 1, wherein the noble metal comprises at least one of Ir, Pt, Pd, Rh, Os, Au, Ag, Re, Ru, W, and Ni.

4. The method of claim 1, wherein the disrupting plasma species comprises at least one of phosphorous, nitrogen, carbon, and boron.

5. The method of claim 1, wherein the co-reactant species comprises at least one of primary silanes, secondary silanes, tertiary silanes, quaternary silanes, primary alkyl amines, secondary alkyl amines, tertiary alkyl amines, methane, $BH_3$, $B_2H_6$, primary alkyl alanes, secondary alkyl alanes, tertiary alkyl alanes, phosphine, germanes, dihalides, hydrohalide acids, carbon, nitrogen, oxygen, and boron.

* * * * *